United States Patent [19]
Leblebicioglu

[11] Patent Number: 5,369,376
[45] Date of Patent: Nov. 29, 1994

[54] PROGRAMMABLE PHASE LOCKED LOOP CIRCUIT AND METHOD OF PROGRAMMING SAME

[75] Inventor: Hakan Leblebicioglu, Northport, N.Y.

[73] Assignee: Standard Microsystems, Inc., Hauppauge, N.Y.

[21] Appl. No.: 800,373

[22] Filed: Nov. 29, 1991

[51] Int. Cl.$^5$ .......................................... H03L 7/093
[52] U.S. Cl. ........................................ 331/8; 331/16; 331/17; 331/25
[58] Field of Search ........................... 331/8, 16, 17, 25

[56] References Cited

U.S. PATENT DOCUMENTS

| | | | |
|---|---|---|---|
| 4,182,994 | 1/1980 | Aschwanden | 331/1 A |
| 4,305,045 | 12/1981 | Metz et al. | 331/1 A |
| 4,355,413 | 10/1982 | Sato | 455/183 |
| 4,504,800 | 3/1985 | Plouviez | 331/1 A |
| 4,629,999 | 12/1986 | Hatch et al. | 331/1 R |
| 4,689,581 | 8/1987 | Talbot | 331/1 A |
| 4,771,249 | 9/1988 | Burch et al. | 331/17 |
| 4,808,884 | 2/1989 | Hull et al. | 375/120 |
| 4,829,258 | 5/1989 | Volk et al. | 328/155 |
| 4,931,749 | 6/1990 | Walters | 331/4 |
| 5,095,288 | 3/1992 | Dent | 331/17 |
| 5,121,085 | 6/1992 | Brown | 331/8 |

OTHER PUBLICATIONS

"Programmable Calculator Computes PLL Noise, Stability," published by Hayden Publishing Co., Inc. and reprinted from Electronic Design, (vol. 29, No. 7), Mar. 31, 1981.

"Charge-Pump Phase-Lock Loops," by Floyd M. Gardner, published by IEEE Transactions On Communications, (vol. Com. 28, No. 11, Nov. 1980. pp. 1849-1858.

"Suppress Phase-Lock-Loop Sidebands Without Introducing Instability," publihsed by Hayden Publishing Co., Inc. and reprinted from Electronic Design, (vol. 27, No. 19), Sep. 13, 1979.

"Optimize phase-lock-loops to meet your needs—or determine why you can't," published by Hayden Publishing Co., Inc. and reprinted from Electronic Design, (vol. 26, No. 19), Sep. 13, 1978.

"Analyze, don't estimate, phase-lock-loop," published by Hayden Publishing Co., Inc. and reprinted from Electronic Design, (vol. 26, No. 10), May 10, 1978.

*Primary Examiner*—Siegfried H. Grimm
*Attorney, Agent, or Firm*—Hopgood, Calimafde, Kalil & Judlowe

[57] ABSTRACT

Programmable phase locked loop circuit and method of programming same. The cross-over frequency of the phase locked loop circuit can be changed solely by programming the gain constants of the phase-locked loop, while preserving the phase margin at each programmed operating frequency.

5 Claims, 11 Drawing Sheets

PROGRAMMABLE PHASE LOCKED LOOP CIRCUIT AND METHOD OF PROGRAMMING SAME

BACKGROUND OF INVENTION

1. Field of Invention

The present invention relates to a programmable phase-locked loop circuit implementable as, for example, an integrated circuit on a semiconductor substrate, and also to a method of programming the same without requiring different timing elements to be switched into or within the loom filter in order to program its operation over a range of stable operating frequencies.

2. Brief Description of the Prior Art

Phase-locked loop (PLL) circuits are commonly used in a wide variety of electronic systems. In frequency synthesis applications, phase-locked loop circuits are employed to ensure precision and stability. Phase-locked loons in such applications function fundamentally by receiving a predetermined reference frequency from a precision crystal and providing a locked output frequency which is a predetermined multiple of the reference frequency. A phase detector is typically used to compare the frequency of the reference with the locked output frequency after having been divided by the predetermined factor. The phase detector produces a control signal which is proportional to an error between the two frequencies being compared. The control signal is typically filtered by a loop filter to derive a voltage for controlling a voltage controlled oscillator. The voltage controlled oscillator provides the locked output frequency. A frequency divider circuit is coupled between the voltage controlled oscillator and the phase detector to complete a closed circuit loop. In general, the function of the loop filter is to permit fast locking of the cutout frequency while avoiding frequency instability problems during steady state operation.

Phase-locked loop circuits are also commonly used to synchronize data being transferred between the host processor and associated data storage and communication devices. In communication applications, phase-locked circuits are generally employed to generate a clock signal which is frequency or phase referenced to an external input signal. Depending on the particular application, the function of the clock signal will vary.

In computer systems, a recording media device controller is provided for executing CPU initiated commands to various recording medium storage devices, e.g., hard or floppy disk systems. This includes writing properly formatted serial data onto the magnetic disk and accurately recovering data therefrom. Data written onto a disk consists of logic ones and zeros which are written at a particular data rate. In order to accurately read data from the disk, the data rate of the signal being read must be known. This process is facilitated by encoding the data being written onto the disk so that the signals written onto the disk include clock information as well as data information. A variety of encoding schemes have been developed for encoding clock and data signals. U.S. Pat. No. 4,808,884 discloses one common encoding scheme, in which data is encoded on a disk in a modified frequency modulation (MFM) format. The MFM signal actually recorded onto the disk during write operations is a digital signal derived from the original non-return-to-zero (NRZ) data stream and a synchronized clock signal.

Although the disk rate has a known ideal value, the actual clock rate of the data will vary from the ideal value due to several factors. These factors include variations in the speed that the data track moves past the read head of the disk drive system. Causes of such speed variations include eccentricity and warping of the circular data tracks. In addition to variations in the actual data rate, the timing of the encoded pulses read from a disk typically deviate from the ideal due to (i) high frequency noise at the read head and (ii) a shifting of bit positions due to the magnetic field of adjacent bits of opposite polarity. The cumulative effect of noise and peak shifting results in random jitter (i.e. movement of transition pulses from their ideal positions), which is unrelated to variations in the data rate. Since the clock is recovered by reading the encoded pulses, the jitter can adversely affect the recovery of the clock signals.

Due to the various factors described above, the clock rate of recorded data must be determined by analyzing the read data and generating the clock and window signals at the appropriate frequency in order to track the data. During disk drive read operations, encoded transition pulses are read and the clock signal is recovered by a phase-Locked loop clock recovery circuit driven by the encoded transition pulses read from the disk.

In general, the phase-locked loop clock recovery circuit includes a voltage controlled oscillator employed to generate the clock signals. The output of the oscillator is applied to a phase detector where its phase is compared to the phase of the input signal (i.e. read transition pulses). The output of the phase detector is a signal with low frequency components proportional to the phase error and high frequency components resulting from bit jitter. The output of the phase detector is applied to a low pass filter which eliminates the high frequency components resulting from bit jitter, and ensures stability within the closed loop. The output of the filter is a control voltage which is applied to the oscillator to control its output frequency. The recovered clock signal from the phase-locked loop clock recovery circuit is then used to synchronize the read transition pulses, and then decode the synchronized transition pulses to produce NRZ data in a manner well known in the art.

While phase-locked loop circuits have performed generally well in read and write channels of recording media device controllers, recent developments have created significant challenges to their performance. For example, in recording media devices permitting "zone-bit" recording, the magnetic recording disk is divided up into different recording zones, each disposed about its center of rotation at a different radius. As the disk rotates at an essentially constant angular frequency under the control of a PLL drive circuit, the relative tangential velocity of the rotating disk past the write and read heads is greatest for the recording zones disposed at the greatest radial distance away from the center of rotation. Consequently, data can be written onto and read from the outer recording zones at substantial higher data rates which are proportional to the radial distance of each zone. As a result, the information storage capacity of disks employing zone bit recording can be greatly increased.

To achieve such high density recording, the write channel of the recording media controller must be capable of generating a plurality of clock signals for use with the data encoder. Each clock signal must have a frequency which is a function of the radial distance of the recording zone. Typically, this is achieved using a PLL frequency synthesizer which is programmed to generate a different clock signal for each recording zone on the disk thereof.

Similarly, the read channel of the recording media controller must be capable of recovering the clock signal from each encoded signal read from the disk. This is typically achieved using a PLL clock recovery circuit operating at about the frequency used to encode the data onto each disk recording zone during data writing operations. To ensure stability during steady state operation, the loop filter of the PLL frequency synthesizer and the PLL clock recovery circuit must be programmed for each new operating frequency which is automatically selected as the write and read heads move from recording zone to recording zone. In prior art phase-locked loop designs, this has typically involved dynamically switching resistive and/or capacitive elements into and out of the loop filter network under computer control. Often, a resistive network external to the recording media controller is employed for this purpose.

While this prior art approach to programming the loop-filter of phase locked loop circuits has permitted generally acceptable system performance even within zone-bit recording systems, it suffers from several significant shortcomings and drawbacks.

In particular, changing the time constants of the loop filter by dynamically switching resistive and/or capacitive elements presents disadvantages in terms of switching filter components, controller design and operation, and associated noise pickup. In addition, as the available discrete filter components have standard fixed values, the resulting PLL circuits are characterized by granular transfer functions even when using expensive high precision low tolerance components.

Thus, there is a great need in the art for a phase-locked loop circuit which can be programmed without the accompanying shortcomings and drawbacks of prior art techniques.

OBJECTS AND SUMMARY OF THE INVENTION

Accordingly, it is a primary object of the present invention to provide a programmable phase locked loom circuit having transfer function characteristics that can be selectively programmed without switching resistive and/or capacitive elements within the loop filter.

It is a further object of the present invention to provided such a phase locked loop circuit whose cross-over frequency can be shifted along the frequency axis and whose phase-margin can be preserved about each selected cross-over frequency solely by programming one or more the gain constants within the phase locked loop circuit.

It is a further object of the present invention to provide such a programmable phase-locked loop circuit which can be implemented as an integrated circuit and in which the cross-over frequency can be adjusted and the phase characteristics of the transfer function preserved at each selected cross-over frequency by programming the charge pump current flowing within the phase error signal amplifier of the phase-locked loop circuit.

It is a further object of the present invention to provide a method of programming a phase-locked loop circuit for stable operation at a plurality of selected operating frequencies within the operating band of the phase-locked loop circuit.

It is yet a further object of the present invention to provide a recording media device controller which can be programmed so that a host computer system can write data onto and read data from one of a plurality of operably associated recording media devices, each having different operating specifications.

It is a further object of the present invention to provide such a programmable recording media device controller which utilizes the phase-locked loop circuit of the present invention to provide a programmable frequency synthesizer in the write channel of the controller, and also, a programmable clock recovery circuit in the read channel of the controller.

It is yet a further object of the present invention to provide such a programmable recording media device controller, which is implemented on a single integrated circuit chip using CMOS technology.

These and other objects of the present invention will become apparent hereinafter.

BRIEF DESCRIPTION OF THE DRAWINGS

For a more complete understanding of the objects of the present invention, the Detailed Description of Illustrative Embodiment is to be taken in connection with the following drawings, in which.

DETAILED DESCRIPTION OF THE DRAWINGS

Figure 1:
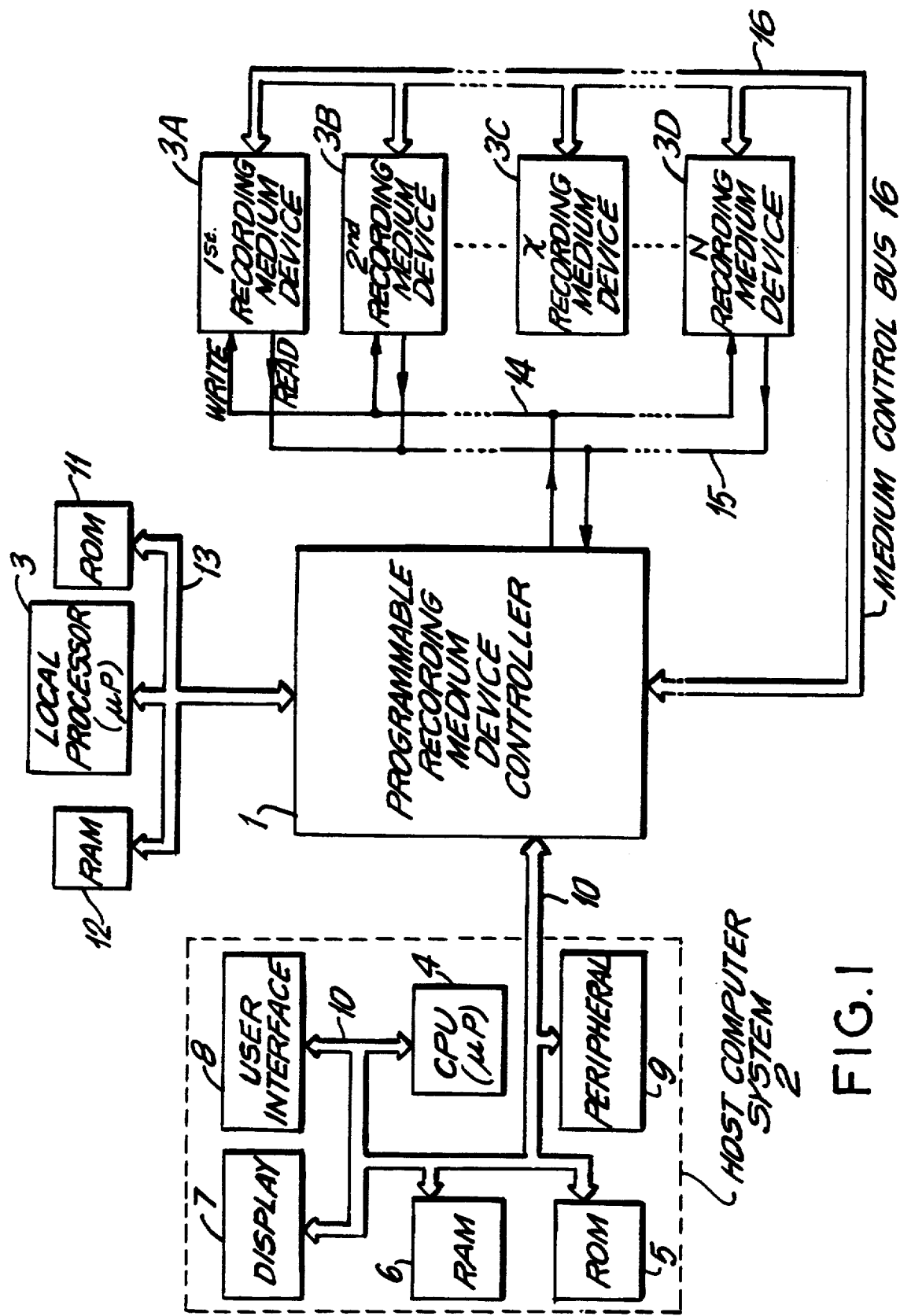
FIG. 1 is a block system diagram showing a host computer system interfaced with a plurality of different recording media devices using the programmable recording media device controller of the present invention.

As illustrated in FIG. 1, programmable recording media device controller 1 of the present invention is provided with a number of ports for interfacing with host computer system 2, a local processor 3 and a plurality of recording media devices 3A through 3D. In general, host computer system 2 comprises a host processor (i.e. microprocessor) 4, program and data storage devices 5 and 6, a visual display unit 7, a user interface 8, such as a keyboard, and other peripheral devices 9. These system components are operably associated with each other and with the first port of controller by way of a host system bus 10, such as an AT or SCSI system bus, both well known in the art.

As will be described in greater detail hereinafter, local processor 3 and associated program and data storage devices 11 and 12 are operably associated with a second port of controller 1 by way of a local system bus 13. This arrangement allows the controller to be programmed with computed programming parameters that are particularly adapted to the operating specifications associated with each recording media device. In order that data can be written into and read from any one of recording media devices, each recording media device is operably connected to the write channel of the controller by way of a write data bus 14, and also to the read channel of the controller by way of a read data bus 15, as shown. To control the operation of each recording media device, a media control bus 16 is provided for transfer of control signals and the like.

Figure 2:
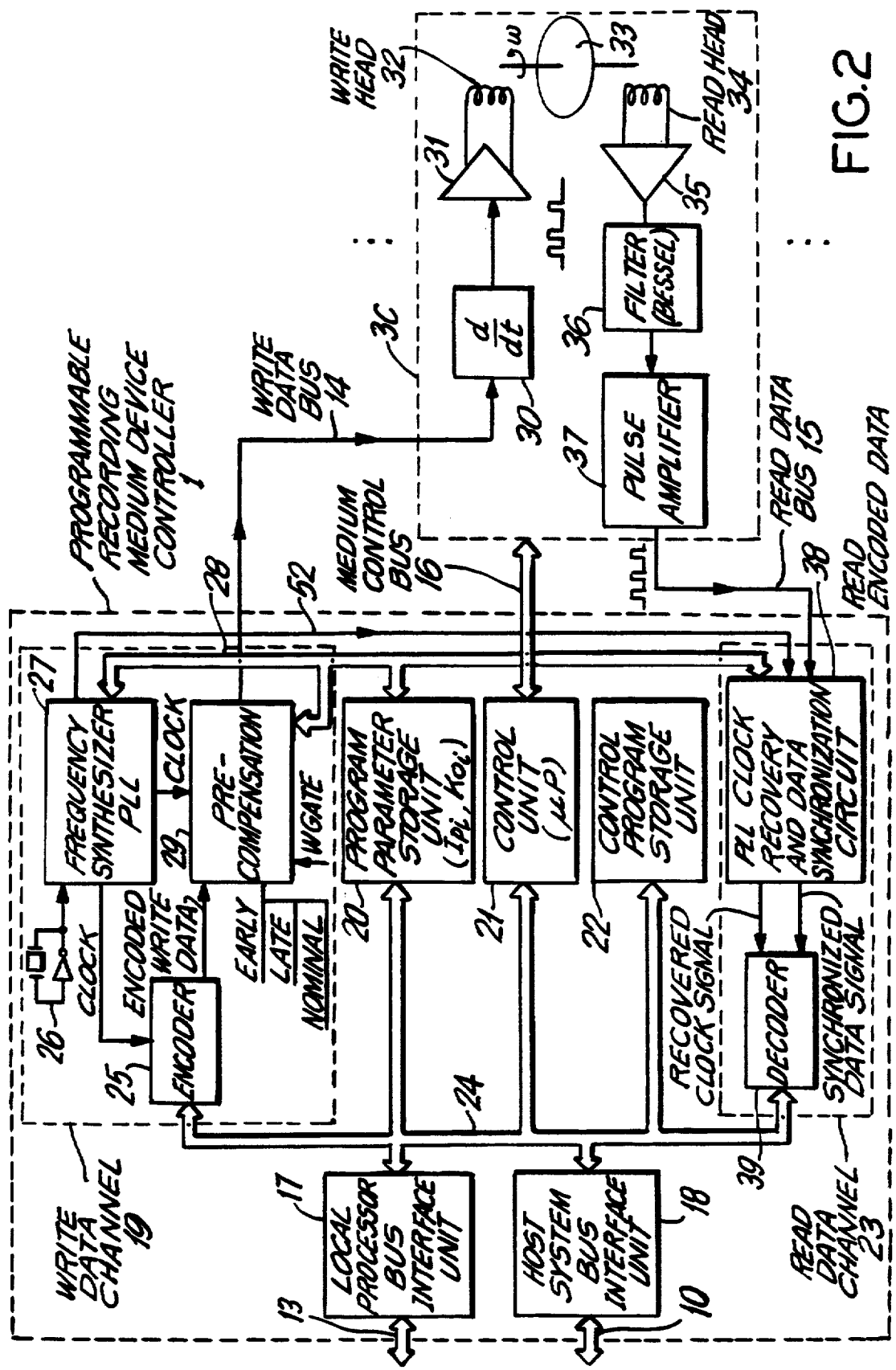
FIG. 2 is a block functional diagram of the programmable recording media device controller of FIG. 1 shown operably associated with a conventional disk drive recording unit.

As illustrated in FIG. 2, recording media device controller 1 comprises a number of components, namely: local processor bus interface unit 17; host system bus interface unit 18; data write channel 19; programming parameter storage unit 20 comprising a plurality of storage registers; a control unit 21; a program storage unit 22 for storing a system control program for the control unit; and a data read channel 23. As shown, these components are operably associated by way of a local bus 24 having a width of 8 bits in the illustrative embodiment. As shown, the host computer system is operably associated with local host system bus interface unit 18, and local processor 3 is operably associated with local bus 24 by way of local processor interface unit 17. Also, each recording media device is operably connected to control unit 21 by way of media control bus 16, and with data write and read channels 19 and 23 by way of write and read data buses 14 and 15, respectively. Host system bus interface unit 18 generally comprises logic circuitry suitable for interfacing the address/data and control line of host system bus 10 with local bus 24. Similarly, local processor bus interface unit 17 comprises logic circuitry suitable for interfacing the address, data and control lines of local system bus 13, with local bus 24.

As illustrated in FIG. 2, write data channel 19 comprises an encoder 25, a reference oscillator 26, a programmable phase-locked loop frequency (PLL) synthesizer 27 and a precompensation circuit 28. Reference oscillator 26 preferably realized as a crystal oscillator, provides a reference frequency to PLL frequency synthesizer 27. As will be described in greater detail hereinafter, when host processor 4 transmits a read or write command to a particular recording media device, control unit 21 will decode the command and cause programming parameters within storage unit 20 to be set within PLL frequency synthesizer 27 by way of programming parameter control bus 28, thus programming its operating and cross-over frequencies and its frequency and phase response characteristics over the operating frequency band. The synthesized clock signal from PLL frequency synthesizer is then provided to encoder 25 to encode a serial data stream transmitted from host system 2 via local bus 24. Typically, the serial data stream is encoded using one of a variety of possible encoding schemes, examples of which include frequency modulation (FM), modified frequency modification (MFM). RLL 2,7 etc. The encoded data stream is then provided to precompensation circuit 29 in order to predistort the to-be-written data stream by a fraction of the period of the data rate, so that during read operations, jitter due to bit shifting is substantially reduced. In general, such predistortion is achieved by programming predetermined amounts of data signal delay (e.g. early, late, and nominal amounts) into the written data signal.

As illustrated in FIG. 2, the encoded serial data stream is then transmitted to the selected recording media control device. The stream is first passed through differentiator circuit 30 so as to produce pulses only at signal level transitions occurring within the encoded data signal. These transition pulses are then amplified through a voltage-to-current amplifier 31 and are then provided to write head 32 supported by apparatus well known in the art. The current pulses flowing through the write head generate a corresponding magnetic flux distribution at a recording zone on disk 33 specified by control signals provided over medial control bus 16. The magnetic flux distribution magnetizes the magnetic media of the disk as it rotates at a predetermined angular frequency characteristic of the selected recording media device.

When the host processor transmits a read data command over local bus 24 to control unit 21, PLL frequency synthesizer 27 will be once again automatically programmed with programming parameters stored in storage unit 20, so that it generates a clock signal suitable for recovering the clock signal and data encoded within the recorded transition pulses. A clamping signal 52 from frequency synthesizer 27 is provided to PLL clock recovery and data synchronization circuit 38 in order to prevent harmonic lock. Read head 34 reads magnetically recorded data from recording zone(s) on disk 33, and produces current pulses which are converted to voltage pulses through current-to voltage amplifier 35. These pulses are passed through a Bessel-type filter 36 and are then amplified by a pulse amplifier 37. Thereafter, these transition pulses are provided to PLL clock recovery and data synchronization circuit 38, which generates a recovered clock signal and a synchronized data signal, respectively. These signals are then provided to decoder 39 for decoding the synchronized data signal. The output of decoder 39 is the original serial data stream which is transmitted to the host system by way of the local bus 24 and host system bus interface unit 18.

Figure 3:
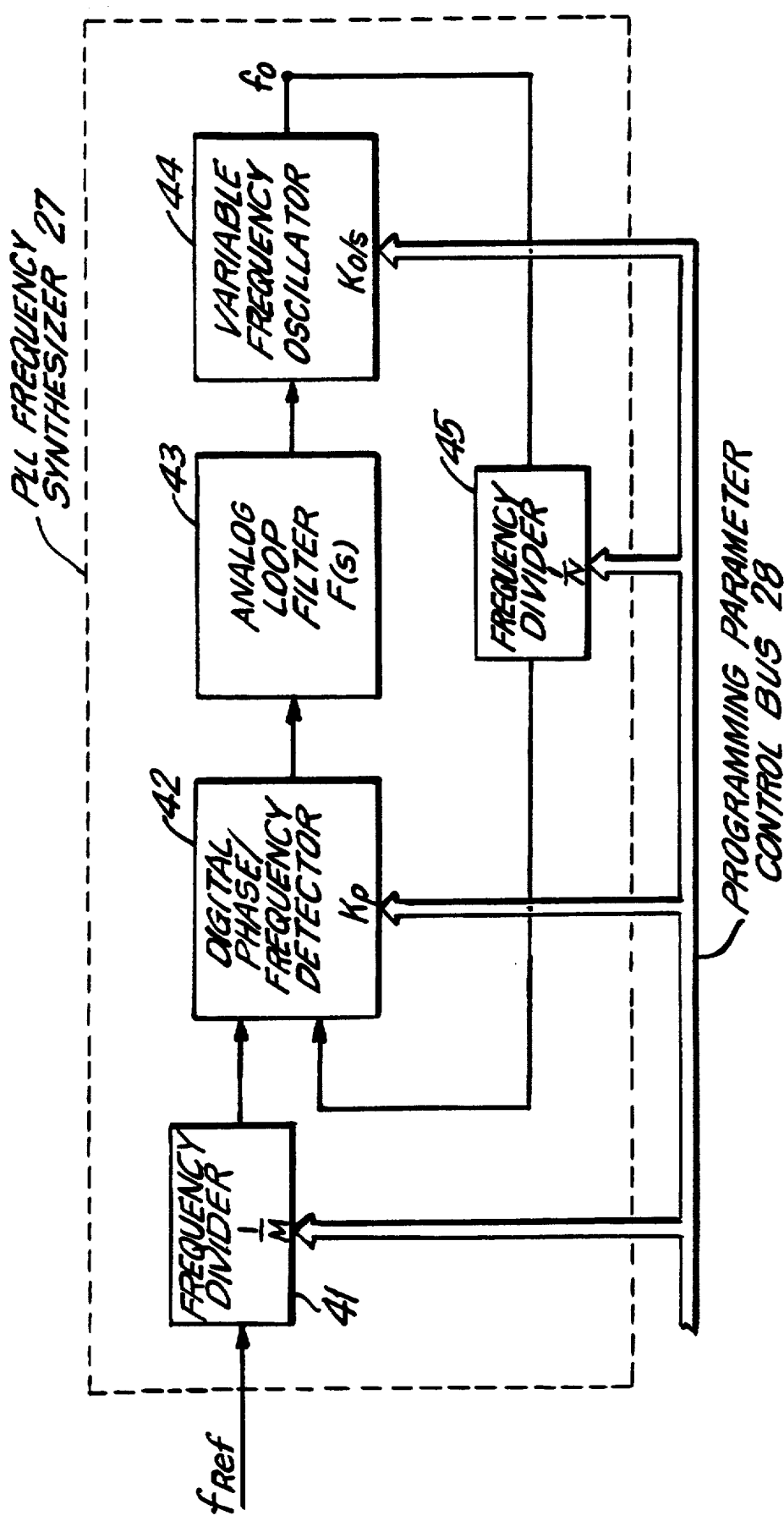
FIG. 3 is a block functional diagram of the programmable phase-locked loop frequency synthesizer of the present invention, integrated with the programmable recording media device controller shown in FIG. 2.
Figure 4:
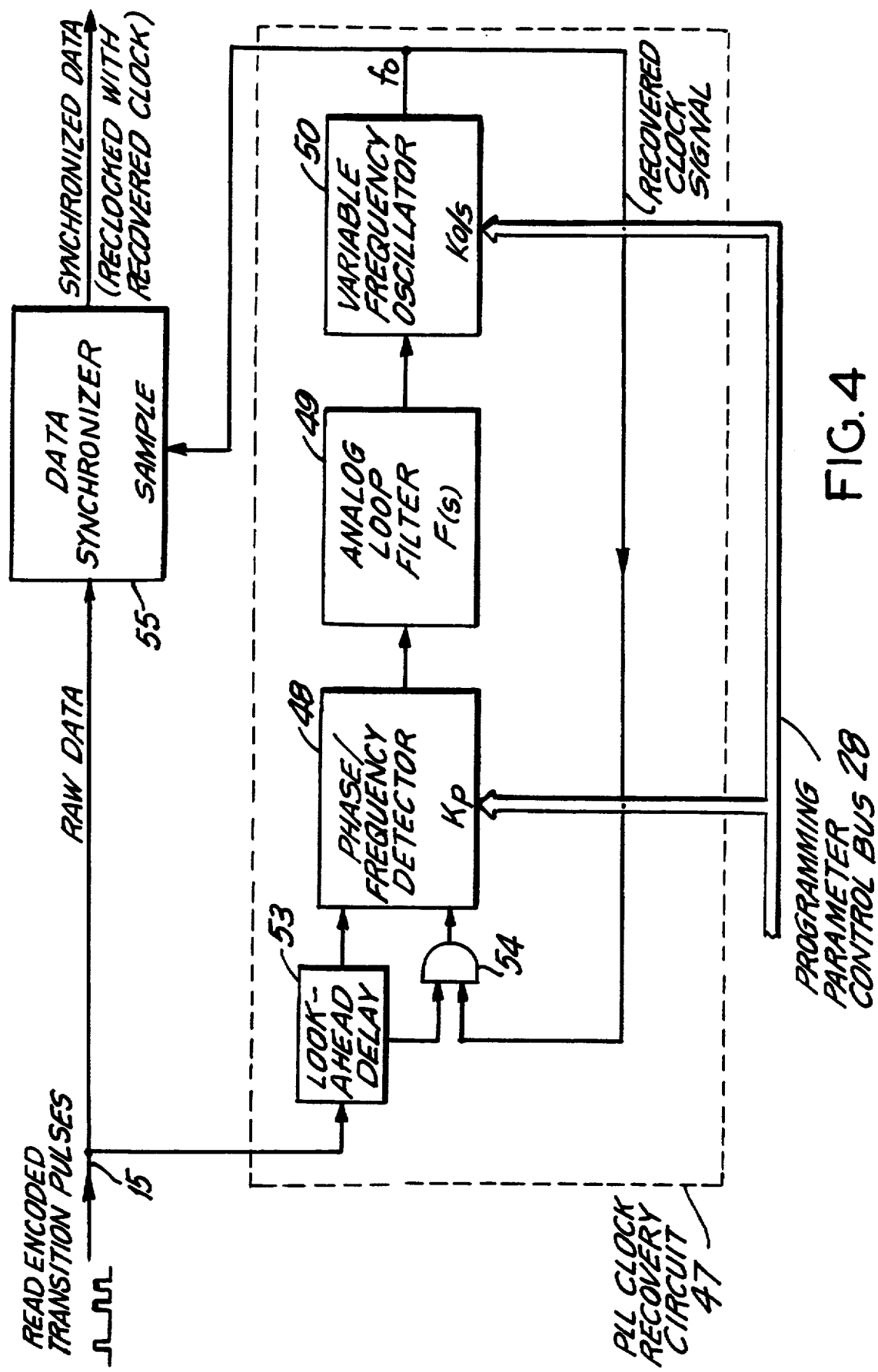
FIG. 4 is a block functional diagram of the programmable phase-locked loop clock and data recovery circuit of the present invention, integrated with the programmable recording media device controller shown in FIG. 2.

In order to more fully appreciate the structure and function of the PLL frequency synthesizer and clock recovery and data synchronization circuit of the present invention, reference is now made to FIGS. 3 and 4 wherein the internal structure of these circuits is revealed.

As illustrated in FIG. 3, PLL frequency synthesizer 27 comprises a first programmable frequency divider network 41, a programmable digital phase/frequency detector 42, an analog loop filter 43, a variable frequency oscillator 44 and a second programmable frequency divider network 45. As shown, first programmable frequency divider network 41 divides reference frequency $f_{ref}$ from crystal oscillator 26 by a programming parameter $M_i$ digitally programmed by programming parameter control bus 28. Digital phase/frequency detector 42 compares the frequency of the reference signal $f_{ref}/M$ with the locked output frequency $f_o$ from variable frequency oscillator 44 after having been first divided by programming parameter $N_i$ also digitally programmed by programming parameter control bus 28.

In general, the operation of frequency/phase detector 42 is characterized by a programmable gain constant $K_p$ and provides a phase/frequency error signal which is proportional to an error detected between the two frequencies being compared. The phase error signal is filtered by loop filter 43 in order to derive a control signal for controlling the output frequency of variable frequency oscillator 44. The operation of variable frequency oscillator 44 is characterized by a gain constant $K_o$ and provides the locked output frequency of. Frequency divider network 45 is coupled between the output of variable frequency oscillator 44 and one input of phase/frequency detector 42 to complete the closed loop circuit.

As illustrated in FIG. 4, PLL clock recovery circuit 47 comprises a digital phase/frequency detector 48 which is provided with electrical transition pulses read from the disk by the read head of a recording media device. In general, the operation of phase detector 48 is characterized by a programmable gain constant $K_p$ and produces a phase error signal proportional to an error detected between the phase of the encoded transition signal and the locked output frequency of variable frequency oscillator 50. The output of phase detector 48 is applied to a low pass analog loop filter 49 which eliminates the high frequency components resulting from bit jitter and ensures stability within the loop 50. The output of loop filter 49 is a control signal which is applied to variable frequency oscillator 50. In general, the operation of variable frequency oscillator 50 is characterized by a programmable gain constant $K_o$ and generates a reconstructed clock signal which is equal to the actual clock rate of the data being read from the disk.

In order that the recovered clock signal has a rate equal to the operating frequency of the programmed PLL frequency synthesizer 27 when no transition pulses are present at the phase detector input, a clamping signal on line 52 is typically provided to between loop filter 49 and oscillator 50. In addition, to ensure that phase detector 48 is disabled when no transition pulses are present on line 15, these pulses are passed through a look-ahead delay unit 53, permitting the recovered clock signal from oscillator 50 to be provided to the phase detector through AND gate 54 only when a transition pulse has been previously detected. In essence, the purpose of look-ahead delay unit 53 and AND gate 54 is to perform phase corrections only at the appropriate incoming data window, and disable the phase detector outside the incoming data window.

The recovered clock signal from PLL clock recovery circuit 47 is then provided to data synchronizer 55 so as to produce a serial stream of synchronized transition pulses from unsynchronized transition pulses provided to its input. The synchronized transition pulses are then provided to decoder 39 for decoding to produce NRZ data in a manner well known in the art.

In order to appreciate how to program PLL frequency synthesizer 27 and clock recovery circuit 47 for stable operation at desired operating frequencies over the operating frequency band, it is appropriate at this juncture to model, using Laplacian transform analysis, a generalized PLL circuit constructed in accordance with the principles of the present invention. Subsequently, important relationships will be derived which will elucidate the theory of operation of the programmable PLL circuit and more particularly, describe a general approach to program the circuit independent of any particular application.

Figure 5:
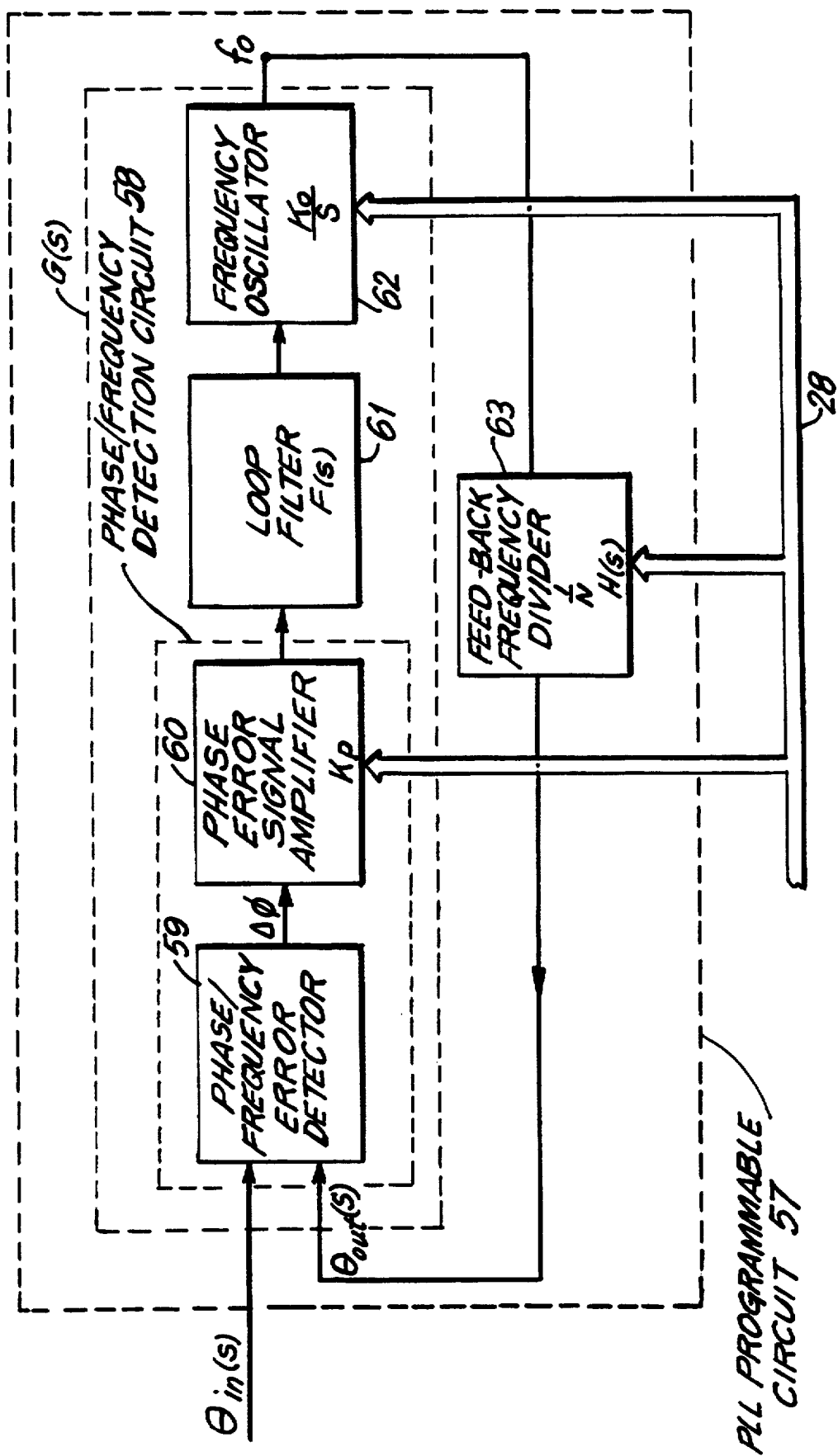
FIG. 5 is a block functional diagram of a generalized programmable phase-locked loop circuit according to the present invention, in which each block is expressed in terms of its Laplacian operator.

Referring to FIG. 5, a generalized programmable PLL circuit 57 of the present invention is illustrated. As shown, generalized PLL circuit 57 comprises a phase/frequency detection circuit 58 including a phase error detector 59 and a phase error signal amplifier 60; an n-th order loop filter 61; a variable frequency oscillator 62; and a feed-back frequency divider 63. In general, the phase error gain constant $K_p$, the oscillator gain constant $K_o$, and frequency divider factor N are programmable through programmable parameter control bus 28. The illustrated Laplacian transformer for each of these loop blocks are presented within each block. The forward gain G(s) of this circuit is described on the Laplacian domain by the transfer function:

$$G(s) = K_p \cdot F(s) \cdot \frac{K_o}{s} \quad (1)$$

whereas, the feedback gain H(s) is described by the transfer function:

$$H(s) = \frac{1}{N} \quad (2)$$

For a generalized loop filter having n+1 zeros and poles, the filter transfer function F(s) can be described as:

$$F(s) = \frac{1}{T_1 s} \cdot \frac{(T_2 \cdot s + 1) \ldots (T_n \cdot s + 1)}{(T_3 \cdot s + 1) \ldots (T_{n+1} \cdot s + 1)} \quad (3)$$

where the values $1/T_i$ for even i value correspond to the location of zero frequencies $f_{iz}$ of the filter and the values $1/T_i$ for odd i values correspond to the location of the pole frequencies $f_{ip}$ of the filter.

By defining a new gain constant $k_m$ as expressed below, $$K_m = \frac{K_p K_o}{N} \quad (4)$$

the open loop gain of the generalized PLL circuit can be described as the transfer function GH(S):

$$GH(S) = \frac{K_m}{s} \cdot \frac{(T_2 s + 1) \ldots (T_n s + 1)}{T_1 s (T_3 s + 1) \ldots (T_{n+1} s + 1)} \quad (5)$$

During steady state operation, where the Laplacian operator s=jw (where $j=\sqrt{-1}$), the variation of the magnitude of equation (5) versus frequency can be plotted to obtain a bode plot. The frequency where the magnitude of GH(jw) is equal to unity, is referred to as the cross-over frequency $w_c$. The phase of the transfer function GH(jw) at this frequency $w_c$, subtracted from $\pi$ radians is referred to as the phase margin. The phase margin of the PLL circuit provides an important parameter regarding the overall stability of the circuit. Significantly, the cross-over frequency $w_c$ also determines the frequency at which the closed loop gain expressed below, $$C(s) = \frac{G(s) H(s)}{1 + G(s) H(s)} \quad (6)$$

is reduced by 0.707, or −3dB, and thus is commonly referred to as the 3dB bandwidth. In short, these two parameters are the most important variables used to control the dynamic behavior of the PLL circuit.

When the PLL circuit is "locked" and operating at steady state, the Laplacian operator "s" in Equation (5) can be replaced by jw to provide an open loop gain having a transfer function as follows:

$$GH(jw) = \frac{-K_m}{w} \cdot \frac{(jwT_2 + 1) \ldots (jwT_n + 1)}{wT_1 (jwT_3 + 1) \ldots (jwT_{n+1} + 1)} \quad (7)$$

At the cross-over frequency $w_c$, the open loop gain is reduced to unity and the magnitude of open loop transfer function (7) can be formulated as:

$$|G(jw)H(jw)|_{w=w_c} = 1 = \frac{K_m}{w_c} \cdot \beta(w_c) \quad (8)$$

where $$\beta(w_c) = \sqrt{\frac{(w_c^2 T_2^2 + 1) \ldots (w_c^2 T_n^2 + 1)}{w_c^2 T_1^2 (w_c^2 T_3^2 + 1) \ldots (w_c^2 T_{n+1}^2 + 1)}} \quad (9)$$

From equations (7) and (8) a basic equation, used to program the cross-over frequency $w_c$ of the generalized PLL circuit, can be expressed as:

$$w_c \beta(w_c) \cdot K_m \quad (10)$$

A well designed PLL circuit will have adequate separation between low frequency pole-zero pairs and high-frequency pole-zero pairs to ensure minimum phase margin variations around the cross-over frequency. Although $\beta$ is a function of w, and equation (10) represents a first order asymptotic approximation, the cross-over frequency $w_c$ of the PLL circuit can be programmed by changing gain constant $K_m$ above, such that for a new cross-over frequency $w_c$ the following relationship holds:

$$w_c' = \alpha \cdot w_c = \beta' \cdot K_m^{\, 1} = \beta' \cdot K_m \cdot \alpha \quad (11)$$

Solving equation (11) for the programming factor $\alpha$ in terms of the gain constant $K_m$ at $w_c$ and the gain constant $K_m'$ at $w_c'$, the following relationship is derived:

$$\alpha = \frac{K_m'}{K_m} \quad (12)$$

The phase margin at $w_c$ can be computed by considering the phase contribution from all the zeroes and poles of the open loop transfer function of equation (7). In simple polar algebra, phase contribution for the i-th zero can be represented by $\phi_{iz} = \text{Tan}^{-1}(w_c \cdot T_{iz})$, and phase contribution for the i-th pole can be represented by $\phi_{ip} = \text{Tan}^{-1}(w_c \cdot T_{ip})$ Expressed in these terms, the phase margin at the cross-over frequency $w_c$ can be computed simply as follows:

$$\phi_{wc} = \Sigma \phi_{iz} - \Sigma \phi_{ip} + \pi \quad (13)$$

If the PLL is programmed, for a new cross-over frequency $w_c'$ wherein $w_c' = \alpha \cdot w_c$, then in order to preserve the phase margin at this new cross-over frequency, each zero component in phase margin equation (13) will contribute a new phase $\phi_{iz} = \text{Tan}^{-1}(\alpha \cdot w_c T_{iz})$ and each pole $i_z$ component will contribute a new phase $\phi_{ip} = \text{Tan}^{-1}(\alpha \cdot w_c T_{ip})$.

Unlike prior art techniques which involve balancing the above trigonometric equation by individually programming each time constant $T_i$ separately so that the phase margin at $w_c$ is preserved at $\alpha w_c$, the programming method of the present invention scales down each time constant $T_i$ by the term $\alpha$ in order that $T_{i2}' = T_{i2}'/\alpha$ and $T_{ip}' = T_{ip}'\alpha$ for all values of i. Using these relationships, the new phase contribution equations can be expressed for all i as:

$$\phi'_{iz} = \tan^{-1}(\alpha \cdot w_c T'_{iz}) = \tan^{-1}(\alpha \cdot w'_c T_{iz}/\alpha)$$
$$= \tan^{-1}(w_c T_{iz}) = \phi_{iz} \quad (14)$$

and $$\phi'_{ip} = \tan^{-1}(\gamma \cdot w_c T'_{ip}) = \tan^{-1}(\alpha \cdot w_c T_{ip}/\alpha)$$
$$= \tan^{-1}(w_c T_{ip}) = \phi_{ip} \quad (15)$$

Notably, when all time constants $T_i$ are scaled down all at once in accordance with the principles of the present invention, the term $\beta$ as defined in equation (9) remains constant. Solving for the programming factor $\alpha$ in terms of the time constants $T_i$, the following equation is obtained:

$$\alpha = \frac{T_i}{T_i'} \quad (16)$$

By combining equations (12) and (16), a general programing constraint for the PLL circuit is provided as follows:

$$K'_m \cdot T'_i = K_m \cdot T_i = \text{constant} \qquad (17)$$

Notably, the terms in equation (17) are frequency independent and the equation holds for all time constants $T_i$ within the open loop transfer function of the PLL circuit. The reason for this is explained by evaluating equation (9) with the expressions $w_c' = \alpha w_c$ and $T_i' = T_i/\alpha$, which results in $i \, \beta(w_c) = \beta(w_c')$ for all values of $T_i$ and $w_c$.

In order to further appreciate the significance of equation (17), it may be expressed in an alternative form using equation (4), as follows:

$$\frac{K_p' K_o' T_i'}{N'} = \frac{K_p K_o T_i}{N} = \text{constant} \qquad (18)$$

Equations (17) and (18) are most important as they set forth a fundamental relationship among the gain constants and the time constants of the programmable PLL circuit of the present invention. Specifically, if the gain $K_m$ is altered by some programming factor $e$ in order to change (i.e. shift) the cross-over frequency $w_c$ to a new cross-over frequency $w_c'$ for stabilizing some new operating frequency $w_o'$ set within the PLL circuit, then to preserve the phase margin and phase response about the new cross-over frequency $w_c' = \alpha w_c$, every time constant, in general, must be scaled down by a programming factor proportional to $\alpha$. As will be explained below, this functional dependence between the loop gain constant $K_m$ and the time constants $T_i$ of the PLL circuit can be realized in a variety of possible ways.

If the resistance term $R_2$ contributing to time constants $T_2$ and $T_3$ is not a constant but in general is a quantity functionally dependent on the loop gain $K_m$ such as the charge pump current (i.e. $I_p = K_p \cdot 2\pi$) of phase error amplifier 58, then the loop parameters can be programmed by adjusting the terms $K_o$, $I_p$ and the ratio of the time constants $T_2$ and $T_3$.

For a predetermined ratio of the capacitances $C_1$ and $C_2$, the zero and pole frequencies $w_z$ and $w_p$ can be shifted provided the impedance function or the resistance used for the product $T = C^*R$ is a function of either or both the filter current $I_p$ and VCO gain $K_o$ in order to satisfy equation (19). In general such a function will shift the high frequency pole and the zero by the term $\alpha$ such that, at the new operating frequency $w_o$, the new zero and new high frequency pole are expressed as $w_z'$ and $w_p'$ respectively.

Figure 6A:
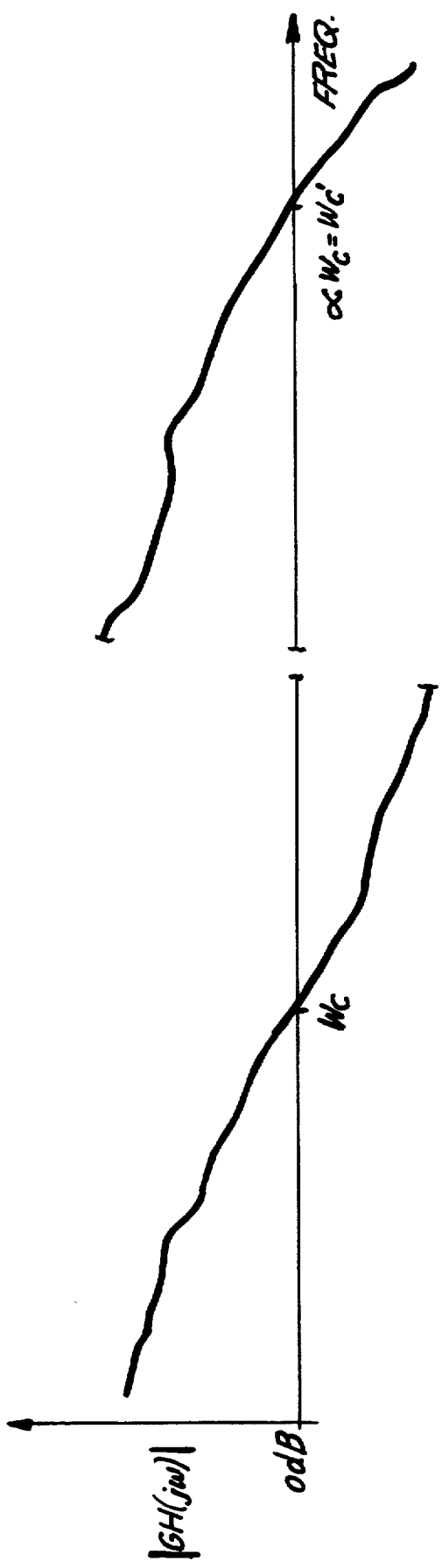
FIG. 6A is a bode plot of the magnitude component of the open-loop transfer function of the phase-locked loop circuit shown in FIG. 5, illustrating that the relative frequency response of the phase-locked loop circuit about any programmed cross-over frequency is essentially the same over the entire operating frequency band of the circuit.
Figure 6B:
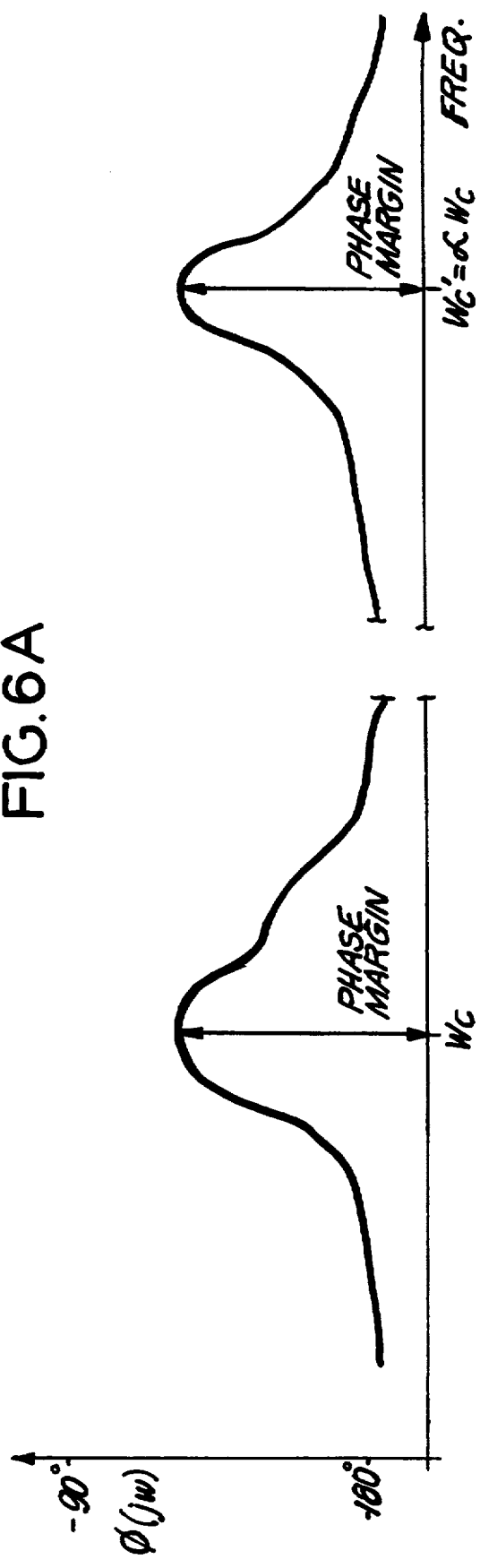
FIG. 6B is a plot of the magnitude of the phase component of the open-loop transfer function of the phase-locked loop circuit shown in FIG. 5, illustrating that the relative phase response and margin about any programmed cross-over frequency is also essentially the same over the operating frequency band of the circuit.

Since the gain $K_m$ is proportional to the crossover frequency, and the timing constants $T_i$ for the zeros and poles are inversely proportional to the operating frequency, the product $K_m T_i$ must be maintained constant in order to preserve the relative shapes of the magnitude and the phase transfer functions as plotted in FIGS. 6A and 6B as these functions are shifted along the frequency axis. Imposing this restriction to the gain equation (7) and noting that the capacitance terms are kept passive (i.e. fixed) while the resistance term is active in the embodiment of the invention, the conclusion is that:

$$K_m' R_i' = K_m R_i = \text{constant} \qquad (19)$$

Figure 7:
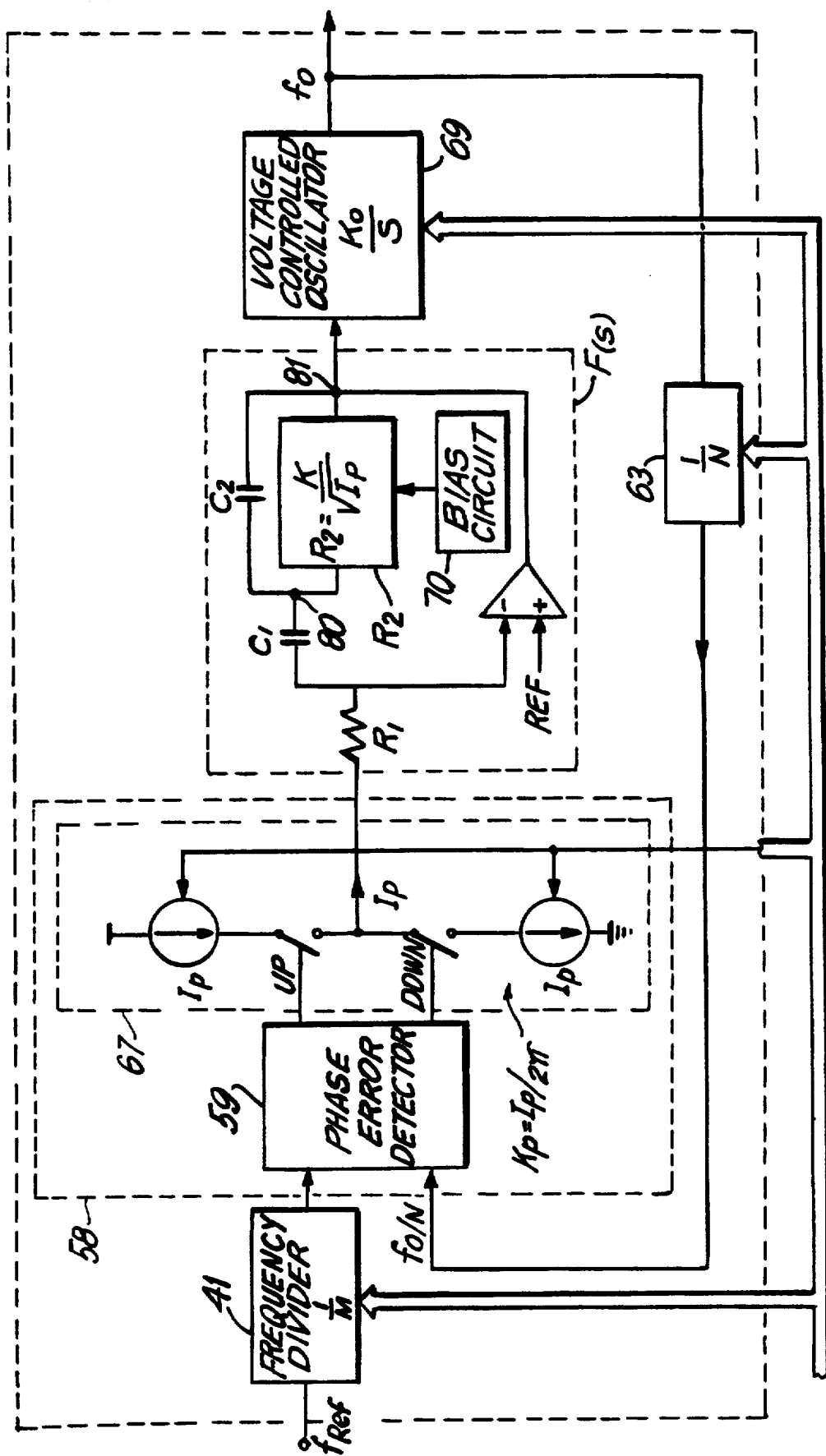
FIG. 7 is a schematic diagram of the illustrative embodiment of the programmable phase-locked loop frequency synthesizer according to the present invention, showing the use of a programmable charge pump as the phase error signal amplifier, a voltage controlled oscillator having a programmable gain constant $K_o$, and a second-order low pass filter having an active resistive element whose resistance $R_2$ is controlled by the programmed charge pump current $I_p$.
Figure 8:
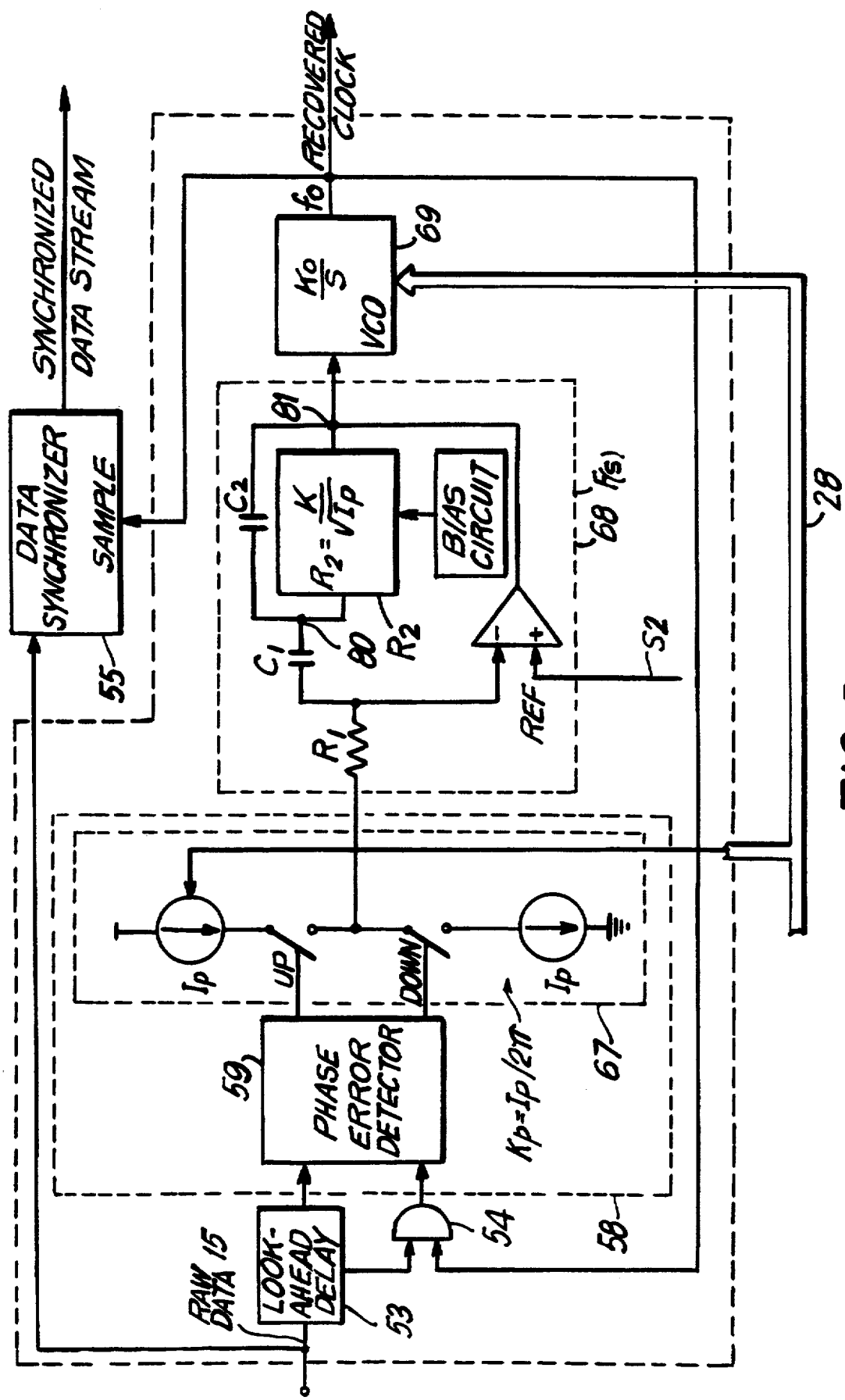
FIG. 8 is a schematic diagram of the programmable phase-locked loop clock recovery circuit of the illustrative embodiment and the data synchronization circuit associated therewith, showing a programmable charge current pump employed as the phase error amplifier, a voltage controlled oscillator having a programmable gain constant $K_o$, and a second order low-pass loop filter having an active resistance element whose resistance $R_2$ is controlled solely by the programmed charge pump current $I_p$.

In the illustrative development, both the programmable PLL frequency synthesizer 65 of FIG. 7 and the PLL recovery circuit 66 of FIG. 8 are realized using a programmable charge pump 67 as phase error amplifier 60, a second order low pass filter as loop filter 68, and a voltage controlled oscillator (VCO) 69 as variable frequency oscillator 62 within the programmable PLL circuit.

Figure 9A:
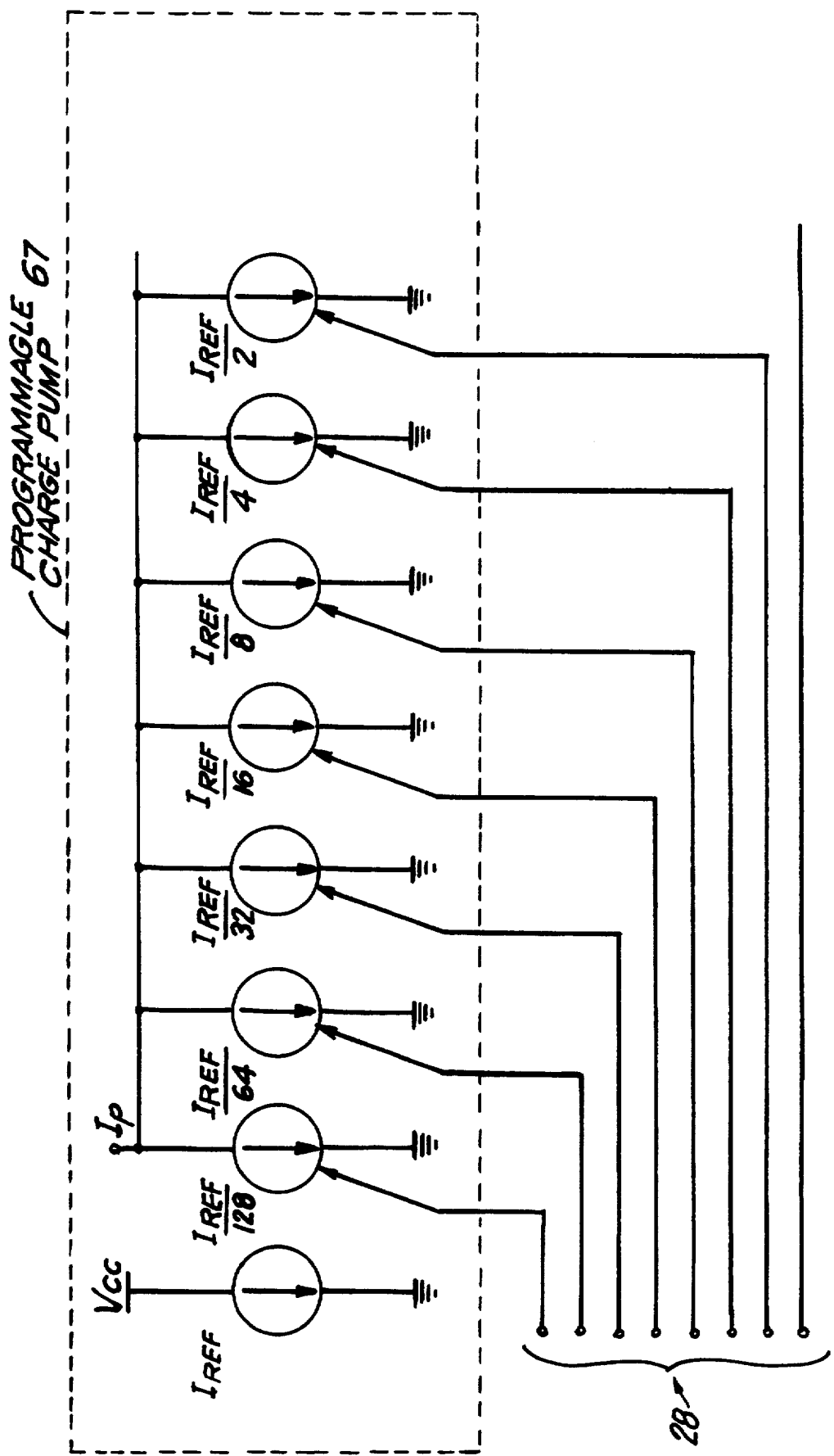
FIG. 9A is a schematic representation of the digitally controlled programmable charge pump illustrated in FIGS. 7 and 8.

As illustrated, the gain constant $K_p$ of charge pump amplifier 60 is $I_p/2\pi$ (in amperes per radian) and the gain constant of VCO 69 is $K_o$ (in radians per volt). For purposes of programming flexibility and extended frequency response control, charge pump current $I_p$, gain constant $K_o$ and feedback gain constant $1/N$ are each digitally controllable by an 8-bit programming parameter control bus 28. Thus, as illustrated in FIG. 9A, programmable charge pump 67 is capable of being programmed to produce 256 possible charge pump current $I_p$ values. Similarly, gain constant $K_o$ and feedback gain constant $1/N$ are also provided with an equal range of programming control.

As the input of the low-pass filter $F(s)$ shown in FIGS. 7 and 8, is pump current $I_p$ and its output is a voltage, the transfer function $F(s)$ can be formulated as a transconductance described in terms of the Laplacian operators as follows:

$$F(s) = \frac{1}{C_1 s} \cdot \frac{T_2 s + 1}{T_3 s + 1} \qquad (20)$$

where $$T_2 = R_2 \bullet (C_1 + C_2) \text{ and } T_3 = R_2 \bullet C_2$$

In order to satisfy the programming constraint expressed in equation (19) while permitting programmable control over both gain constant $K_p = I_p/2\pi$ and time constants $T_2$ and $T_3$ for different cross-over frequencies $w_c' = \alpha w_c$, resistive element $R_2$ in the illustrative embodiment is realized as an active timing element.

In order to derive a mathematical expression specifying the functional dependence between the active timing element $R_2$ and the programmable charge pump current $I_p$ employed in particular illustrative embodiments of the present invention, the open loop transfer function for the generalized PLL circuit can be expressed as:

$$GH(s) = \frac{I_p \cdot K_o}{2 \cdot \pi \cdot s^2 \cdot N \cdot C_1} \cdot \frac{T_2 s + 1}{T_3 s + 1} \qquad (21)$$

Multiplying the numerator and denominator in equation (21) by active element $R_2$ provides the following expression:

$$GH(s) = \frac{I_p \cdot K_o \cdot R_2}{2 \cdot \pi \cdot s \cdot N} \cdot \frac{T_2 s + 1}{R_2 C_1 s (T_3 s + 1)} \qquad (22)$$

where $R_2 C_1$ can be defined as $T_1$ so that equation (22) can be expressed as:

$$GH(s) = \frac{K_{mR}}{s} \cdot \frac{T_2 s + 1}{T_1 s (T_3 s + 1)} \qquad (23)$$

which is of the general form of equation (5).

Notably, the value of the new loop gain constant term $K_{mr}$ contains $R_2$ in the numerator of this expression. By substituting the value of $K_{mr}$ into Equation (19), the following expression is obtained:

$$\frac{K_o \cdot I_p \cdot R_2}{2 \cdot \pi \cdot N} \cdot R_2 = \text{constant} \quad (24)$$

Equation (24), establishes the required analog functional dependence between the total loop gain and the active time constant term for the invention. In the illustrative embodiment of the present invention, this functional interdependency is established between charge pump current Ip and active resistance $R_2$. Notably, however, according to the general programmability constraint expressed in equation (18), it is also possible to practice the present invention by physically controlling $R_2$ through Ko or N, or any combination of the loop gain components.

For a particular range of operation, and a satisfactory cross-over frequency $w_c$ and associated phase margin $\phi$, the oscillator gain constant $K_o$ and frequency divider factor N will be fixed, and thus equation (24) can be expressed as:

$$I_p \cdot R_2^2 = \text{constant}' \quad (25)$$

Solving for active resistance $R_2$, a primary programming constraint for the PLL circuit of illustrative embodiment is given by the following expression:

$$R_2 = \sqrt{\frac{\text{constant}'}{I_p}} \quad (26)$$

This remarkable mathematical expression states that for a PLL circuit employing a programmable current source in the phase detector and a second-order filter having a transconductance transfer function, one can program the crossover frequency of the PLL circuit across its operational frequency range using only one controlled variable, that is provided the time constants $T_i$ contributing to the phase margin $\phi(w_c)$ are related to the loop gain equation by an inverse square root variable such as, for example, charge pump current $I_p$. Notably, this important relationship may be imposed only on the resistive element $R_2$ as in the illustrative embodiments hereof, or on the capacitive element $C_1$, or more generally, to a combination of these elements.

Figure 9B:
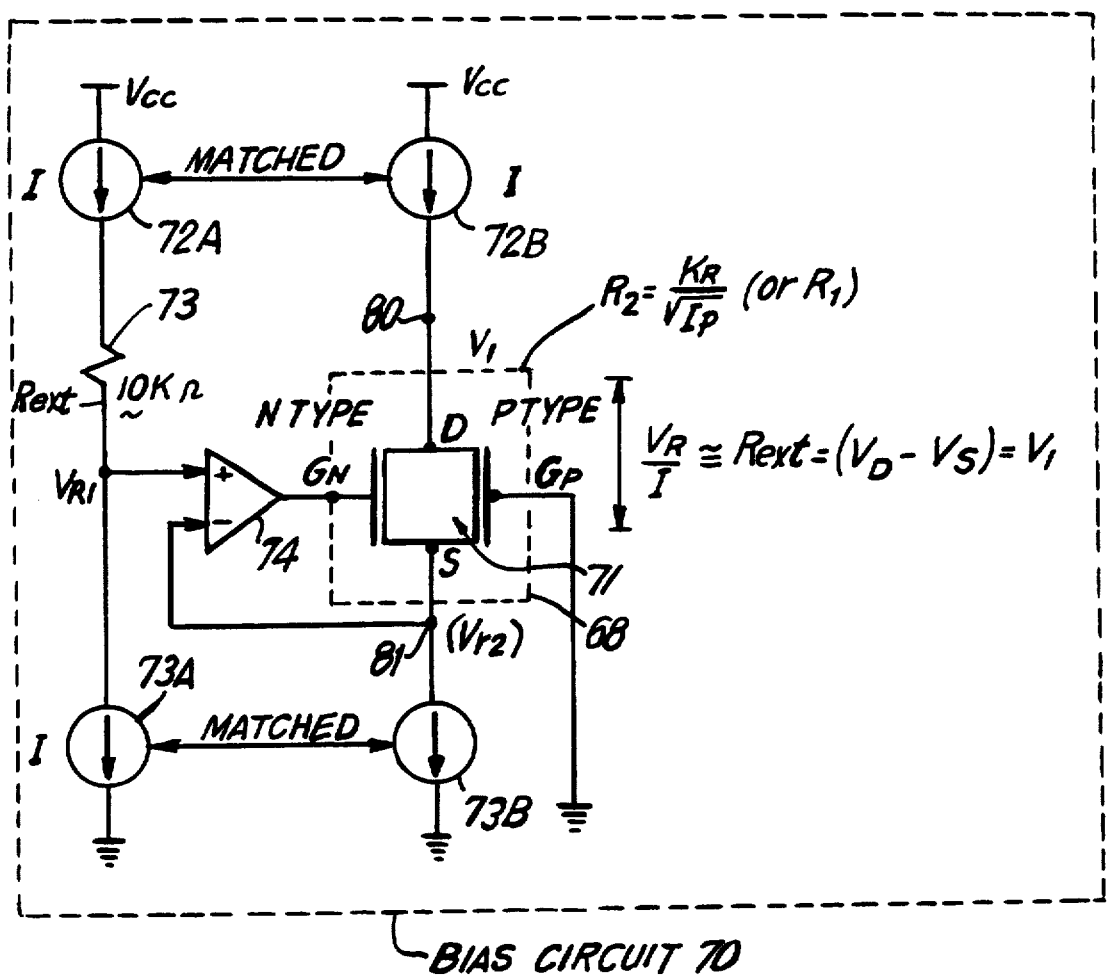
FIG. 9B is a schematic representation of a circuit utilizable in biasing the active resistive element within the loop filter of the phase-locked loop circuits illustrated in FIGS. 7 and 8.
Figure 10:
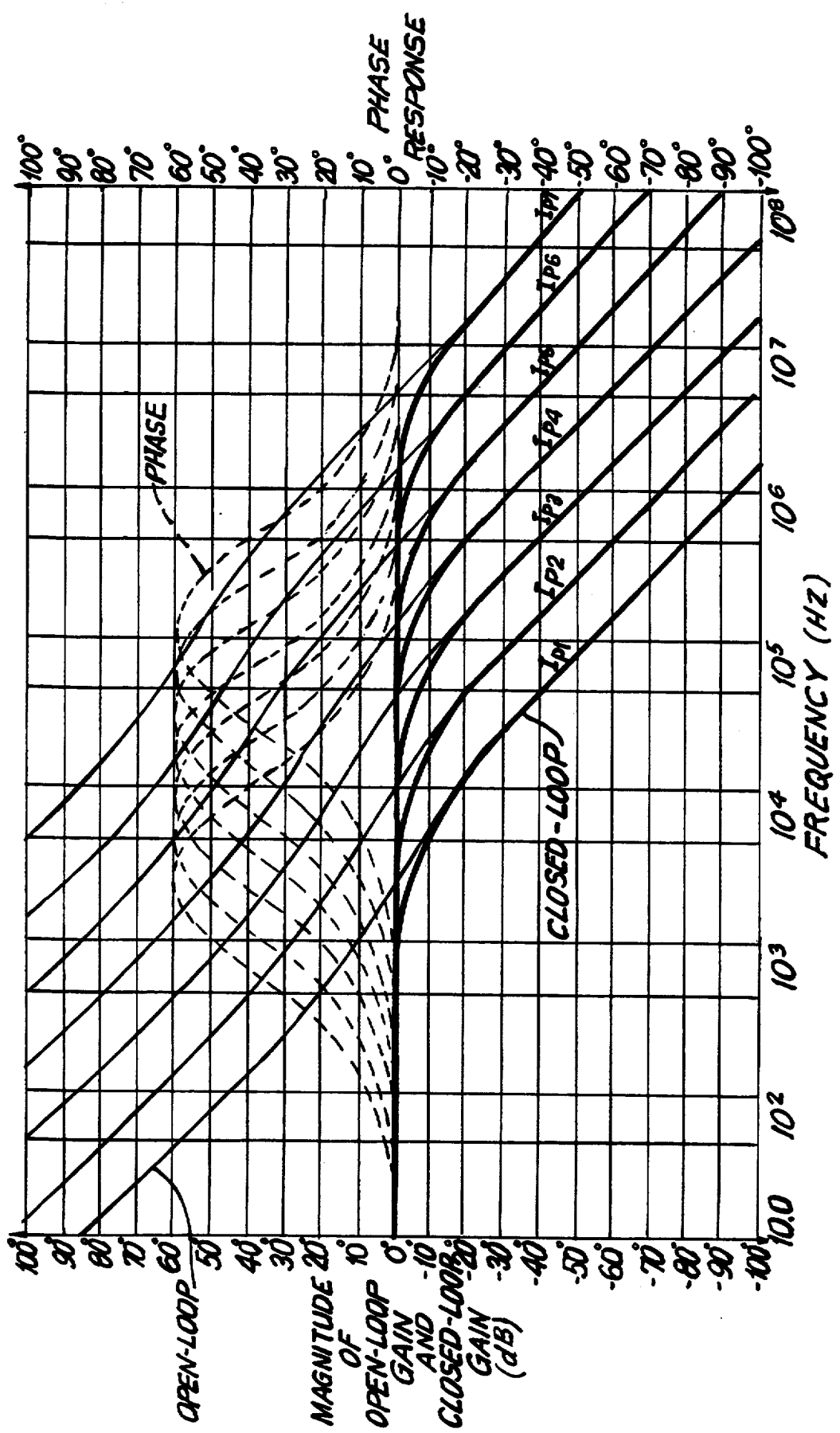
FIG. 10 is a series of bode plots showing the magnitude component of both open and closed loop transfer functions of the phase-locked loop frequency synthesizer and clock recovery circuit of the illustrative embodiment.

In the illustrative embodiment of PLL circuits hereof, the active resistive element $R_2$ is manufactured as a complementary metal oxide (CMOS) transistor 71. As illustrated in FIG. 9B, a biasing circuit 70 is used to bias the transistor at saturation so that its transconductance exhibits the behavior represented as:

$$gm = \frac{\partial (Id)}{\partial Vgs} = 2 \cdot \sqrt{k \cdot \frac{W}{L} \cdot (1 - \lambda \cdot Vds) \cdot Id} \quad (27)$$

where:
k represents intrinsic transconductance;
W represents device width;
L represents device length;
$\lambda$ represents the channel length modulation parameter;
$V_{ds}$ represents drain-source voltage drop; and
$I_d$ represents average drain current in saturation $$Id = k \cdot \frac{W}{L} \cdot (Vgs - V_T)^2 (1 + \lambda \cdot Vds) \quad (28)$$

where $V_{gs}$ represents gate source voltage drop, and $V_T$ represents threshold of the transistor. As illustrated in FIG. 9B, the drain D and source S of transistor 71 are electrically connected between points 80 and 81, respectively, in filter network 68 of FIGS. 7 and 8. As shown, biasing circuit 70 comprises current source 72A, 72B and 73A, 73B which produce reference voltages $V_{R1}$ and $V_{rz}$ across precision resistance 74 and the transistor D-S channel, respectively. These reference voltages are provided to an amplifier 74 whose output voltage is provided to transistor gate $G_N$, while reference voltage $V_{R2}$ is provided to transistor source S, as shown. The voltage drop across drain D and source S is $V_R$ defined in FIG. 9B.

Assuming that the drain conductance and the substrate conductances are negligible and observing from the topology of the second order loop filter F(s) in FIGS. 7 and 8, $I_d$, the average drain current, will be proportional to the average value of charge pump current $I_p$. The CMOS transistor in saturation will exhibit an equivalent small signal impedance provided by:

$$R_2 = \frac{1}{gm} = \frac{1}{2\sqrt{k \frac{W}{L} (1 + \lambda Vds) I_p}} = \frac{K_r}{\sqrt{I_p}} \quad (29)$$

Having specified the transfer function for the low-pass second-order loop filter and the functional dependence between charge pump current $I_p$ and active resistance $R_2$, the open loop gain $K_o$ of the generalized PLL circuit with these features can be described by the transfer function:

$$|GH_s| = \left| \frac{-K_o I_p}{2\pi C_1 w_c^2 N} \cdot \frac{T_2 s + 1}{T_3 s + 1} \right| = 1 \quad (30)$$

where
$T_2 = R_2(C_1 + C_2)$
$T_3 = R_2 \bullet C_2$, and
$R_2 = K_r / 29 \, I_p$ During steady state operation s=jw and Equation (30) can be expressed as follows:

$$|GH_w| = \left| \frac{-K_o I_p}{2\pi C_1 w_c^2 N} \cdot \frac{jw_c \frac{K_r}{\sqrt{I_p}} (C_1 + C_2) + 1}{jw_c \frac{K_r}{\sqrt{I_p}} C_2 + 1} \right| = 1 \quad (31)$$

At cross-over frequency we, open loop gain is described by the following transfer function:

$$GH_{w_c} = \frac{-K_o I_p \alpha}{2\pi C_1 w_c^2 N} \cdot \frac{jw_c \frac{K_r}{\sqrt{\alpha} \sqrt{I_p}} (C_1 + C_2) + 1}{jw_c \frac{K_r}{\sqrt{\alpha} \sqrt{I_p}} C_2 + 1} \quad (32)$$

The magnitude of this transfer function at $w_c$ is equal to unity and is described as follows:

$$|GH_{w_c}| = \left| \frac{-K_o I_p}{2\pi C_1 w_c^2 N} \cdot \frac{jw_c \frac{K_r}{\sqrt{I_p}} (C_1 + C_2) + 1}{jw_c \frac{K_r}{\sqrt{I_p}} C_2 + 1} \right| = 1 \quad (33)$$

The phase margin of this transfer function at cross-over frequency $w_c$ can be computed as:

$$\phi = \tan^{-1}(w_c R_z(C_1+C_2)) - \tan^{-1}(w_c R_z C_2) + \pi \quad (34)$$

and can be expressed in terms of programming parameter $I_p$ as follows:

$$\phi = \tan^{-1}\left(w_c \frac{K_r}{\sqrt{I_p}}(C_1+C_2)\right) - \tan^{-1}\left(w_c \frac{K_r}{\sqrt{I_p}} C_2\right) + \pi \quad (35)$$

When programming the PLL circuit a new cross-over frequency $w_c'$ by increasing gain constant $K_p = I_p/2\pi$ (i.e. charge pump current $I_p$) by programming parameter $\alpha$ ($I_p' = \alpha I_p$), the resistance $R_2$ in each time constant $T_2$ and $T_3$ will be automatically scaled down in accordance with equation (16), as resistance $R_2$ and the charge pump current $I_p$ are related in the illustrative embodiment as follows:

$$R_2 = \frac{K_r}{\sqrt{I_p'}} = \frac{K_r}{\sqrt{\alpha}\sqrt{I_p}} = \frac{K_R}{\sqrt{\alpha}} \cdot \frac{1}{\sqrt{I_p}} \quad (36)$$

Consequently, the open loop transfer function (21) will change to the form:

$$GH_{wc'} = \frac{-K_o I_p \alpha}{2\pi C_1 w_c'^2 \alpha N} \cdot \frac{jw_c' \cdot \frac{K_r}{\sqrt{\alpha}\sqrt{I_p}}(C_1+C_2)+1}{jw_c' \cdot \frac{K_r}{\sqrt{\alpha}\sqrt{I_p}} C_2 + 1} \quad (37)$$

The magnitude of the above transfer function at $w_c'$ is equal to unity and is described as follows:

$$|GH_{wc'}| = \left|\frac{-K_o I_p}{2\pi C_1 W_c^2 N} \cdot \frac{jw_c \sqrt{\alpha} \frac{K_r}{\sqrt{\alpha}\sqrt{I_p}}(C_1+C_2)+1}{jw_c \sqrt{\alpha} \frac{K_r}{\sqrt{\alpha}\sqrt{I_p}} C_2 + 1}\right| = \quad (38)$$

$$|GH_{wc}| = 1$$

and $$||GH(jw_c')|| = ||GH(jw_c)|| = 1 \quad (39)$$

The phase margin at this new cross-over frequency $w_c'$ is given by:

$$\phi_{wc'} = \tan^{-1}\left(w_c \sqrt{\alpha} \frac{K_r}{\sqrt{\alpha}\sqrt{I_p}}(C_1+C_2)\right) - \quad (40)$$

$$\tan^{-1}\left(w_c \sqrt{\alpha} \frac{K_r}{\sqrt{\alpha}\sqrt{I_p}} C_2\right) + \pi$$

which can be reformulated into the following expression:

$$\phi_{wc'} = \tan^{-1}\left(w_c \frac{K_r}{\sqrt{I_p}}(C_1+C_2)\right) - \quad (41)$$

$$\tan^{-1}\left(w_c \frac{K_r}{\sqrt{I_p}} C_2\right) + \pi = \phi_{wc}$$

Since the phase margin is preserved at the new cross-over frequency $w_c'$, this relationship can be used to express the new cross-over frequency of the loop $w_c'$ as a function of the old cross-over frequency $w_c$ and programming factor $\alpha$ as follows:

$$w_c' = \sqrt{\alpha}\, w_c$$

The above analysis sets forth several important features regarding third-order PLL circuit design of the illustrative embodiment, in particular. Foremost, if the range of programmable control over the gain constant $K_o$ permits tuning of the PLL circuit to a satisfactory operating frequency, e.g. $w_o = 50 \cdot w_c$ and an acceptable phase margin through selection of capacitance ratio $C_1/C_2$, then a new PLL operating frequency $w_o' = 50 w_c \sqrt{\alpha}$ can be programmed by simply increasing charge pump current $I_p$ by the programming factor $\alpha$ alone, and without changing the phase margin or dynamic characteristics of the loop. In addition, as a change in pump current $I_p$ by $\alpha$ causes a $\sqrt{\alpha}$ change in cross-over frequency $w_c$ location, sixteen (16) possible cross-over frequency hopping values can be obtained using an 8-bit control over charge pump current $I_p$. However, it is necessary that the VCO gain constant $K_o$ and charge current pump $I_p$ have sufficient range without saturating the phase-locked loop.

By making the ratio of the internal timing capacitances variable, the bandwidth and phase margin of the PLL circuit can be independently controlled. In the illustrated embodiment which is particularly adapted for magnetic recording media applications, programmable phase margin control is achieved by using fixed capacitance $C_1$ and four programmable values of $C_2$ in order to provide programmable phase margins of 45, 52.5, 60 and 62.5. degrees. Additionally, by providing a sufficient range of control over gain constant $K_o$ (e.g. 1:50) and using an 8-bit control bus for controlling charge pump current $I_p$, the values of capacitances $C_1$ and $C_2$ for the time constants $T_1$, $T_2$, and $T_3$ described hereinabove, are realizable within a CMOS integrated circuit chip having a typical operation range of about 0.25 to about 50.0 mps.

The third-order PLL circuit described hereinabove has no external filter components. Consequently, its operation is programmed by first determining a set of programmable parameters for each operating frequency $w_c$ and then storing these parameters within registers contained, for example, in program parameter storage unit 20 described hereinabove. In order to determine such parameters in a simple manner, a programming technique will be described below.

The system designer first must determine the operating range of voltage controlled oscillator 69 in FIGS. 7 and 8. This can be achieved by representing the transfer function of the oscillator as a series of points plotted as output frequency versus input voltage. A polynomial curve is then fitted to this data so as to compensate for the possibility that the VCO transfer function is not perfectly linear over the operating frequency range of the PLL circuit. The slope value obtained from the first derivative of the polynomial function at each j-th operating point is selected as the gain constant $K_{oj}$ of the voltage controlled oscillator. These gain constant values are then selected so that the required gain $K_o$ for the PLL circuit has the maximum voltage swing at the input of the oscillator without causing the loop to saturate.

Depending on the average frequency spread of the data patterns provided to the phase-detector input, the system designer will then determine the pattern density variable d, which provides a measure of code density and is a direct function of the coding scheme used. For example, d will vary from 1 for a PLL frequency synthesizer where the input pattern is actually the reference crystal and completely periodic, to approximately 0.67 for random data coded in RLL 2,7. While parameter d is best viewed as a source parameter, it is commonly modelled as a circuit parameter by the addition of a block before the input phase signal. Consequently, the gain constant $K_m$ can be adjusted to incorporate this parameter in a manner well known in the art.

The system designer will then specify the cross-over frequency $w_c$ for the lowest operating frequency $w_o$ within the operating frequency band of the PLL circuit. Typically, $w_c$ will be 1/25 to about 1/50 of $w_o$, e.g. $w_o = 50 w_c$. Selection of cross-over frequency $w_c$ based on a desired operating frequency $w_o$ is primarily a function of external system dynamics and coding scheme employed.

In order to maximize the phase margin of the third-order PLL circuit at the selected lowermost cross-over frequency $W_c$, the phase function $\phi(w)$ is differentiated to obtain:

$$\frac{d(\phi)}{dt} = \frac{T_2}{1 + (w \cdot T_2)^2} - \frac{T_3}{1 + (w \cdot T_3)^2} = 0 \tag{42}$$

where $T_3$ is the time constant corresponding to the high frequency pole, and $T_2$ is the time constant corresponding to the zero of the desired PLL system. Setting equation (42) above to zero at the inflection point $w_c$ and solving for w and then evaluating the resulting equation at the cross-over frequency $w_c$, an expression for $w_c$ in terms of $T_2$ and $T_3$ is obtained:

$$w_c = \frac{1}{\sqrt{T_2 \cdot T_3}} \tag{43}$$

Notably, choosing the lowermost cross-over frequency $w_c$ at the maximum phase margin point corresponds to the geometric mean of the time constants $T_2$ and $T_3$. This equation can then be used to solve the phase equation $\phi$ in order to obtain an expression for tan $\phi$ in terms of the time constant $T_2$ and $T_3$, as follows:

$$\tan(\phi) = \frac{T_2 - T_3}{2 \cdot \sqrt{T_2 \cdot T_3}} = \frac{\frac{C_1}{C_2}}{2 \sqrt{\frac{C_1 + C_2}{C_2}}} = \frac{b-1}{2\sqrt{b}} \tag{44}$$

where the parameter b is defined as:

$$b = c_1/c_2 + 1 \tag{45}$$

and specifies the ratio of the location of the dominant zero and dominant high frequency pole of the third-order PLL system.

Eliminating the term $T_2$ in equation (43) and (44) results in the expression:

$$T_3 = \frac{1 - \sin(\phi)}{\cos(\phi) \cdot w_c} \tag{46}$$

which specifies the location of the high frequency pole $T_3 = f_p^{-1}$. Then using equations (43) and (46) the location of the zero $T_2 = f_z^{-1}$ is provided by:

$$T_2 = \frac{1}{w_c^2 \cdot T_3} \tag{47}$$

For a desired phase margin, time constants $T_2$ and $T_3$ can be computed using the above equations. Thereafter, the parameter b can be computed. As the magnitude of the open loop gain transfer function is reduced to unity at cross-over frequency $w_c$, open loop gain equation (21) can be solved for charge pump current $I_p$ as:

$$I_p = \frac{w_c^2}{K_m} \sqrt{\frac{1 + (w_c \cdot T_3)^2}{1 + (w_c \cdot T_2)^2}} \tag{48}$$

where loop gain constant $K_m$ is constant for predetermined values of loop divider factor N, capacitance $C_1$, and gain constant $K_o$, and is equal to:

$$K_m \approx \frac{K_o}{2 \cdot \pi \cdot C_1 \cdot N} \tag{49}$$

Notably, at the phase inflection point $w_c$, the time constants $T_2$ and $T_3$ are sufficient to determine the magnitude of the charge pump current $I_p$ within the PLL system. Also, in terms of both IC chip current and required size of capacitor area, a value of $C_1$ of about 100 picoFarads has been found sufficient to realize a transfer function for the PLL system running from 0.25 Mhz to ever 50 Mhz. Thus, the value of programmable capacitor $C_2$ can be determined from the equation (44). Thereafter, using the equation (29) and the equation $T_3 = R_2 C_2$, the gain constant $K_r$ for active resistance $R_2$ can be determined from the expression:

$$K_r \approx \frac{T_2 \sqrt{I_p}}{C_2} \tag{50}$$

As parameter $K_r$ relates to geometric and physical specifications of the CMOS transistor 71 used during the fabrication process of the third-order PLL circuit, equation (50) can be formulated in the terms of CMOS process parameters by the expression:

$$K_r \approx \frac{1}{2 \sqrt{k \frac{W}{L}}} \tag{51}$$

where K is a process constant, W is the width of the transistor channel, and L is the variable length of the transistor channel. In the illustrated embodiment, parameter L is controlled by control bus 28 to provide 8 logarithmic values of L, i.e. 1L, 2L, 4L, 8L, 16L, 32L, 64L and 128L.

The above procedure teaches how parameters $K_o$, $K_r$, $C_1$, $C_2$, $R_2$ and $I_p$ can be determined for the purpose of programming the lowermost cross-over frequency $w_c$ while achieving a maximized phase margin for the third-order PLL circuit. Now any number of new cross-over frequencies $w_{ci}=w_c\sqrt{a}$ can be programmed for new operating frequencies (e.g. $w_{oi}=50w_{ci}$ by simply programming a new charge pump current $I_p a$. At each new cross-over frequency, the maximized phase margin and relative phase and magnitude transfer functions will automatically be preserved, although shifted along the frequency axis by the programming factor $a$. Using an 8 bit parameter control bus, $(2^8)^{0.5}=16$ possible sets of stable operating frequencies $w_c$ and thus sets of program parameters can be computed for subsequent storage in programming parameter storage unit 20.

When programming the PLL frequency synthesizer of the present invention, frequency dividing factors M• and N• can be digitally programmed in order to obtain an output frequency which equals N/M $f_o'$. In the illustrative embodiment, $M_i=1, 2, 4$ or 16 and $N_i=1, 2, 3 \ldots 64$, in order to synthesize up to 64 different clock signals for use in data writing and reading operations.

After having computed the various programming parameters described above, for the set of different operating frequencies, local processor 3 can be used to program the controller IC chip 1 shown in FIG. 1. This involves transferring the set of computed programming parameters from storage device 12 into designated registers within programming parameter storage unit 20. When this operation is completed, the PLL frequency synthesizer and clock recovery circuits hereof are programmed and ready for operation.

The loop filter of the illustrated embodiment is a second order filter of a particular topology. However, any order loop filter of any topology can be used when practicing the present invention.

While the particular illustrative embodiment shown and described above will be useful in many applications, further modifications to the present invention herein disclosed will occur to persons skilled in the art. All such modifications are deemed to be within the scope and spirit of the present invention defined by the appended claims.

What is claimed is:

1. A programmable phase locked loop circuit comprising:

phase detection means being characterized by a phase error gain constant $K_p$, and adapted for detecting the phase error between first and second input signals and generating as output a phase error signal representative of said phase error;

a loop filter characterized by one or more phase margin contributing time constants $T_i$ and being operably associated with said phase detection means to receive as input said phase error signal and produce as output a control signal, each said phase margin contributing time constant $T_i$ being functionally dependent on an active element in said loop filter, and each said active element having a time constant contributing property functionally dependent on said phase error gain constant $K_p$, and said phase error gain constant $K_p$ being proportional to a programmable current in said phase detection means, and said time constant contributing property of each said active element being functionally dependent on said programmable current;

a variable frequency oscillator being characterized by an oscillator gain constant $K_o$, and producing as output said second input signal having a frequency controlled by said control signal;

said programmable phase locked loop circuit having, when programmed, a cross-over frequency, a phase margin at said cross-over frequency determined by said phase margin contributing time constants, and an open loop gain $K_m$ proportional to the product of said phase error gain constant $K_p$ and said oscillator gain constant; and programming means for programming the cross-over frequency of said programmable phase locked loop circuit and the phase margin thereof at said cross-over frequency, by adjusting said programmable current to one of a plurality of different programmable current values, whereby the cross-over frequency of said programmable phase locked loop circuit is automatically programmed to one of said plurality of different cross-over frequencies while the phase margin of said programmable phase locked loop circuit is maintained substantially constant at each of said plurality of different cross-over frequencies.

2. The programmable phase locked loop circuit of claim 1, wherein said programming means increases said programmable current by a factor $a$, said phase error gain constant $k_p$ is increased by said factor $a$, and each said phase margin contributing time constant is decreased by said factor $a$.

3. The programmable phase locked loop circuit of claim 1, wherein said time constant contributing property of each said active element is electrical resistance, and said active element is physically realized in the form of a transistor biased in saturation, and wherein each said programmable current value is produced from an electronically controlled charge pump.

4. A method of electronically programming a programmable phase locked loop circuit, comprising the steps:

(a) providing a device employing a programmable phase locked loop circuit, said programmable phase locked loop circuit including (1) phase detection means being characterized by a phase error gain constant $K_p$, and adapted for detecting the phase error between first and second input signals and generating as output a phase error signal representative of said phase error, (2) a loop filter characterized by one or more phase margin contributing time constants $T_i$ and being operably associated with said phase detection means to receive as input said phase error signal and produce as output a control signal, each said phase margin contributing time constant $T_i$ being functionally dependent on an active element in said loop filter, and each said active element having a time constant contributing property functionally dependent on said phase error gain constant $K_p$, and said phase error gain constant $K_p$ being proportional to a programmable current in said phase detection means, and said time constant contributing property of each said active element being functionally dependent on said programmable current, (3) a variable frequency oscillator being characterized by an oscillator gain constant $K_o$, and producing as output said second input signal having a frequency controlled by said control signal, (4) said programmable phase locked loop circuit having, when programmed, a cross-over frequency, a phase margin at said cross-over frequency determined by said phase margin contributing time constants, and an open loop gain $K_m$ proportional to the product of said phase error gain constant $K_p$ and said oscillator gain constant, and (5) programming means for programming the cross-over frequency of said programmable phase locked loop circuit and the phase margin thereof at said cross-over frequency, by setting said programmable current to one of a plurality of different programmable current values, whereby the cross-over frequency of said programmable phase locked loop circuit is automatically programmed to one of said plurality of different cross-over frequencies while the phase margin of said programmable phase locked loop circuit is maintained substantially constant at each of said plurality of different cross-over frequencies; and (b) programming said cross-over frequency to a selected one of said plurality of different cross-over frequencies by solely setting said programmable current to one of said plurality of different programmable current values, whereby the cross-over frequency of said programmable phase locked loop circuit is automatically programmed to said selected cross-over frequency while the phase margin of said programmable phase locked loop circuit is maintained substantially constant.

5. The method of claim 4, where in step (a), said time constant contributing property of each said active element is electrical resistance, and each said active element is physically realized in the form of a transistor biased in saturation, and where in step (b) said selected programmable current value is produced from an electronically controlled charge pump.

* * * * *

UNITED STATES PATENT AND TRADEMARK OFFICE
CERTIFICATE OF CORRECTION

PATENT NO. : 5,369,376
DATED : November 29, 1994
INVENTOR(S) : Hakan LEBLEBICIOGLU Page 1 of 2

It is certified that error appears in the above-indentified patent and that said Letters Patent is hereby corrected as shown below:

Col. 1, line 14, delete "loom" and insert --loop--.
Col. 1, line 38, delete "cutout" and insert --output--.
Col. 1, line 45, before "circuits" insert --loop--.
Col. 3, line 49, delete "loom" and insert --loop--.
Col. 4, line 37, after "FIG 1" insert --,--.
Col. 10, line 11, after "frequency" delete "$w_c$" and insert --$w_c'$--.
Col. 10, line 29, after ($w_c \cdot T_{ip}$) insert --.--.
Col. 10, line 35, delete the comma "," between "programmed" and "is".
Col. 13, line 35, delete "crossover" and insert --cross-over".
Col. 13, line 37, insert a comma --,-- between "is" and "provided".
Col. 14, line 3, before "72A" insert --pairs--.
Col. 14, line 40, delete "$R_2=K_r/29I_p$" and insert --$R_2=K_r/\ I_p$--.
Col. 14, line 50, after "frequency" delete "we" and insert --$w_c$--.

UNITED STATES PATENT AND TRADEMARK OFFICE
CERTIFICATE OF CORRECTION

PATENT NO. : 5,369,376
DATED : November 29, 1994
INVENTOR(S) : Hakan Leblebicioglu It is certified that error appears in the above-indentified patent and that said Letters Patent is hereby corrected as shown below:

Col. 16, line 30, before "pump" insert --charge--.

Col. 16, line 52, delete "mps" and insert --Mps--.

Col. 18, line 43, before "50Mhz" delete "ever" and insert --over--.

Signed and Sealed this

Twenty-second Day of July, 1997

*Attest:*

BRUCE LEHMAN

*Attesting Officer*  Commissioner of Patents and Trademarks